(12) United States Patent
Rodder et al.

(10) Patent No.: US 6,251,761 B1
(45) Date of Patent: Jun. 26, 2001

(54) PROCESS FOR POLYCRYSTALLINE SILICON GATES AND HIGH-K DIELECTRIC COMPATIBILITY

(75) Inventors: Mark S. Rodder, University Park; Sunil V. Hattangady, McKinney, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/447,175

(22) Filed: Nov. 22, 1999

Related U.S. Application Data
(60) Provisional application No. 60/109,685, filed on Nov. 24, 1998.

(51) Int. Cl.[7] ................. H01L 21/3205; H01L 21/4763; H01L 21/8238; H01L 21/336
(52) U.S. Cl. .................... 438/591; 438/199; 438/216; 438/287
(58) Field of Search ................. 438/240, 287, 438/216, 591, 761, 785, 197, 199, 217, 229, 230, 231, 263, 262, 261, 257, 266, 592, 584

(56) References Cited

U.S. PATENT DOCUMENTS

| 5,352,623 | * | 10/1994 | Kamiyama | 438/396 |
| 5,910,880 | * | 6/1999 | DeBoer et al. | 361/311 |
| 6,015,739 | * | 1/2000 | Gardner et al. | 438/287 |

OTHER PUBLICATIONS

Grider et al, A 0.18 micrometer CMOS Process Using Nitrogen Profile–Engineered Gate dielectrics, 1997 Symposium on VLSI Technology Digest of Technical Papers, pp 47–48, Jun. 1997.*

* cited by examiner

*Primary Examiner*—Charles Bowers
*Assistant Examiner*—Thanhha Pham
(74) *Attorney, Agent, or Firm*—Peter K. McLarty; W. James Brady, III; Frederick J. Telecky, Jr.

(57) ABSTRACT

A gate stack (104) including a gate dielectric with reduced effective electrical thickness. A high-k dielectric (108) is formed over the silicon substrate (102). Remote plasma nitridation of the high-k dielectric is performed to create a nitride layer (107) over the high-k dielectric (107). A conductive layer (110) is formed over the nitride layer (107) forming the gate electrode.

19 Claims, 2 Drawing Sheets

PROCESS FOR POLYCRYSTALLINE SILICON GATES AND HIGH-K DIELECTRIC COMPATIBILITY

This application claims priority under 35 USC §119(e)(1) of provisional application number 60/109,685 filed Nov. 24, 1998.

CROSS-REFERENCE TO RELATED PATENT/ PATENT APPLICATIONS

The following co-assigned pending patent applications are hereby incorporated by reference:

| Patent No./Ser. No. | Filling Date | TI Case Number | Inventors |
| --- | --- | --- | --- |
| 60/019,429 | 6/7/96 | TI-23502P | Hattangady et al. |
| 60/035,375 | 12/5/96 | TI-22980P | Kraft et al. |
| 60/092,909 | 07/15/98 | TI-27159P | Hattangady et al. |

FIELD OF THE INVENTION

The invention is generally related to the field of MOSFET transistors and more specifically to the gate stack formation including a high-K gate dielectric.

BACKGROUND OF THE INVENTION

Presently, there is a great demand for shrinking semiconductor devices to provide an increased density of devices on the semiconductor chip that are faster and consume less power. The scaling of devices in the lateral dimension requires vertical scaling as well so as to achieve adequate device performance. This vertical scaling requires the effective electrical thickness of the gate dielectric to be reduced so as to provide the required device performance.

Silicon dioxide has been the preferred gate dielectric material. However, newer technologies are requiring effective thicknesses of the silicon dioxide below currently believed limits (e.g., <10 Angstroms). Therefore, there is interest in using higher dielectric constant (high-K) materials such as tantalum pentoxide and barium-strontium-titanate. Using a higher-K material allows for a greater physical thickness while obtaining a lower effective electrical thickness.

Unfortunately, most of the high-K materials being considered contain oxygen and/or are formed in an oxygen ambient. Therefore, during formation, silicon dioxide is formed on the surface of the substrate between the high-K dielectric and the substrate. The thickness of the silicon dioxide is such that much of the advantage to be obtained with the high-K material is lost.

In addition to silicon dioxide that can be formed during dielectric formation, the formation of polycrystalline silicon as a gate material on the high-K dielectric can also result in the formation of silicon dioxide. This has led to the use of metal gates on high-K dielectric material.

The threshold voltage of CMOS transistors is a critical parameter for the proper functioning of circuits made up of these devices. Among other factors, the threshold voltage is determined by the work function of the gate material and the semiconductor substrate. In using metal gates, the work function of the metal used is such that additional processing steps are required to obtain the correct threshold voltage. This additional processing can degrade the CMOS transistor performance. It is therefore desirable to use polycrystalline silicon for the gate material over high-K dielectrics without forming silicon dioxide on the high-K dielectric material.

High-K dielectrics are also being evaluated for memory applications as a storage capacitor cell dielectric. In some memory applications, it will also be desirable to form a polycrystalline gate over a high-K dielectric.

SUMMARY OF THE INVENTION

An embodiment of the instant invention uses remote plasma nitridation (RPN) of the high-K dielectric prior to the formation of a polycrystalline silicon gate. The RPN inhibits oxidation of the high-K dielectric during polycrystalline silicon gate formation resulting in a gate dielectric structure having a thinner effective electrical thickness.

An advantage of the invention is providing a gate dielectric structure having a reduced effective electrical thickness.

This and other advantages will be apparent to those of ordinary skill in the art having reference to the specification in conjunction with the drawings.

DETAILED DESCRIPTION OF THE INVENTION

The invention will now be described in conjunction with a 0.1 micron MOSFET transistor. It will be apparent to those of ordinary skill in the art that the benefits of the invention can be applied to other transistor sizes with appropriate scaling of the dimensions described herein. The benefits can also be applied to transistor structures different from that described below, such as those transistors having raised source/drain regions.

Figure 1:
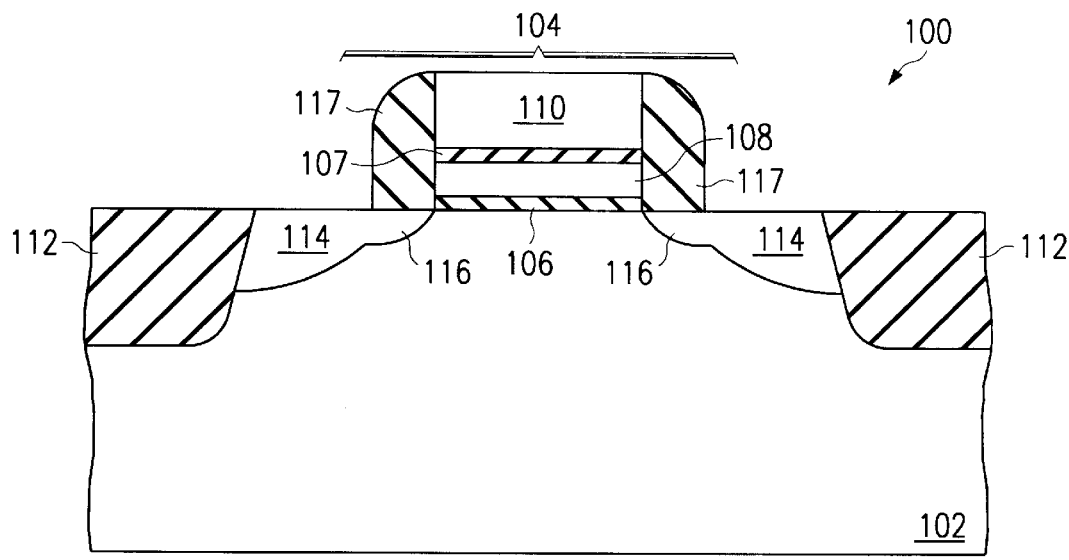
FIG. 1 is a cross-sectional diagram of a transistor having gate dielectric according to the invention.

A MOSFET transistor 100 having a gate stack 104 according to the invention is shown in FIG. 1. Transistor 100 is located in semiconductor body 102 and is separated from other transistors (not shown) by isolation regions 112. As shown isolation regions 112 are shallow trench isolation. However, other isolation mechanisms known in the art may alternatively be used. Source/drain regions 114 and drain extension regions 116 are located in semiconductor body 102 on opposite sides of gate stack 104.

Gate stack 104 comprises a multi-layer gate dielectric. The first layer is an interface control layer preferably a silicon-oxynitride layer 106. It has a physical thickness on the order of around 5 to 20 Angstroms (preferably around 10 Angstroms) and a dielectric constant greater than that of silicon dioxide (~4) and less than that of silicon nitride (~7). Overlying silicon-oxynitride layer 106 is a high-K dielectric layer 108. High-K is used herein to refer to a dielectric material having a dielectric constant greater than 10. Layer 108 will typically comprise an oxygen-containing high-K dielectric material such as Ta2O5, BaTiO3, TiO2, CeO2, or BST. However, layer 108 may alternatively comprise a high-K material that is formed using a process that allows oxygen from another source to enter the environment. The thickness of high-K layer 108 is on the order of 50 Å to 110 Å. The gate stack further comprises a layer of nitride 107 which overlies the high-K dielectric with a thickness on the order of 2–10 Angstroms.

Gate stack 104 further comprises a gate electrode 110 overlying the nitride layer 107. Gate electrode 110 preferably comprises polysilicon as the nitride layer 107 will prevent the formation of silicon dioxide. Gate electrode 110 can also comprise a metal. The metal chosen may need to be matched to the dielectric layer 108 in terms of process integration and its work function that ultimately dictates the threshold voltage of the device. In an embodiment of the invention, the high-K layer 108 comprises Ta2O5 and the gate electrode 110 comprises a layer of tungsten (W) overlying the nitride layer 107.

Figure 2A:
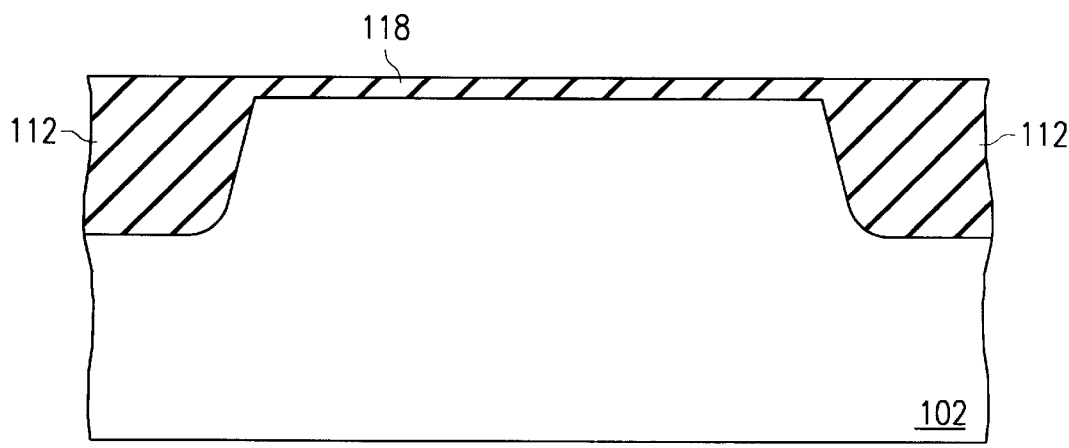
FIGS. 2A–2D are cross-sectional diagrams of a partially fabricated transistor at various steps in the fabrication of the transistor of FIG. 1.

A method for forming gate stack 104 according to an embodiment of the invention will now be described. A thin silicon dioxide layer 118 is formed over the surface of semiconductor body 102 as shown in FIG. 2A. Layer 118 has a thickness on the order of 10 Angstroms to 20 Angstroms (preferably around 15 Angstroms). Layer 118 may be as thin as possible while still obtaining a continuous layer of oxide. The maximum thickness for layer 118 depends on the desired electrical thickness of the final gate dielectric. For practical purposes, this may be 15–20 Angstroms for a 0.10 micron technology.

Figure 2B:
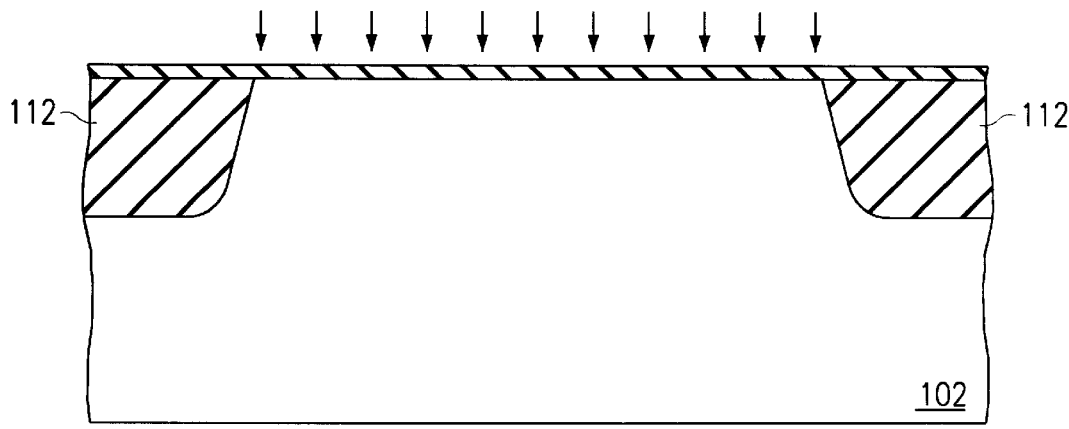

Referring to FIG. 2B, silicon dioxide layer 118 is subjected to remote plasma nitridation (RPN). RPN converts layer 118 from silicon dioxide to silicon-oxynitride layer 106. The effective electrical thickness of layer 106 is decreased due to a change in the dielectric constant of the material. Silicon oxynitride layer 106 has a physical thickness on the order of 15 Angstroms and a dielectric constant greater than that of silicon dioxide (~4) and less than that of silicon nitride (~7).

The source of nitrogen for the plasma may be a nitrogen containing precursor such as $N_2$ or $NH_3$ or their mixture with each other or any other inert gas (He, Ar, etc.) or oxidizing gas (NO, $N_2O$, $O_2$, etc.). The plasma is preferably a high density plasma. The plasma may be generated by any one of a number of sources. For example, one of the following sources may be used: helicon; helical-resonator; electron-cyclotron resonance; or inductively coupled. The substrate 102 can be unbiased, in which case the ionized substances are accelerated by the plasma potential (on the order of 20 Volts) and then implanted into the silicon dioxide layer 118 surface. A bias can be applied to the substrate 102 to further accelerate the ions from the plasma and implant them deeper into the surface. Either a DC or RF bias may be applied to the substrate 102. As an example, the following process conditions may be used: plasma density between $1\times10^{10}$ to $1\times10^{12}$; nitrogen flow between 1 and 100 sccm; pressures on the order of 1 to 50 mTorr, temperature in the range of 77 K to 773 K; substrate bias in the range of 0 to 50 Volts; and a duration in the range of 10 to 60 seconds.

Figure 2C:
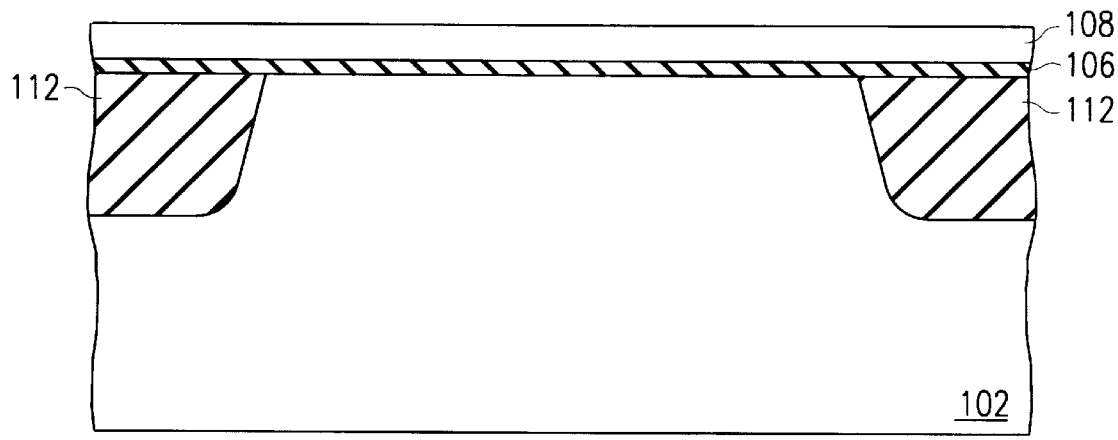

After RPN, high-K dielectric layer 108 is formed over silicon oxynitride layer 106 as shown in FIG. 2C. Layer 108 will typically comprise an oxygen-containing high-K dielectric material such as Ta2O5, BaTiO2, TiO2, CeO2, or BST. However, layer 108 may alternatively comprise a high-K material that is formed using a process that allows oxygen from another source to enter the environment. The method for forming high-K dielectric layer 108 will vary depending on the material used. Improved methods for depositing many of these materials are currently being developed.

In a preferred embodiment of the invention, Ta2O5 is used as layer 108. It may be formed in the following manner using a LPCVD process. After RPN, the device is loaded into a furnace at low temperature (e.g., ~300° C.). The wafers are preferably placed in alternating slots of a ring boat with side dummy wafers at the ends. The boat and side dummy wafers should be coated with at least 100 Å of TaO5, otherwise thickness uniformity may be a problem.

After loading, the furnace pump is purged and the temperature is ramped to the deposition temperature (i.e., on the order of 410–450° C.) and stabilized before the reactive gases are introduced. N2 or NH3 may be used as a carrier gas during the heating phase. NH3 may ensure that the surface stays nitrided.

A metalorganic source is then introduced to react with oxygen at low pressure for deposition. Metalorganic sources include tantalum pentaethoxide (TAETO) or tantalum tetra-ethoxide (TATDMAE). The tantalum sources are viscous liquids and could be supplied in bubblers with a carrier gas such as N2 bubbled through to carry the tantalum to the furnace. However, the bubbler would have to be operated at 120–150° C. and long-term stability may be a problem. A preferred delivery technique is to use a positive displacement or CVD pump. The tantalum source is then dispensed to a heated vaporizer and mixed with a carrier gas such as N2 and then delivered to the furnace. alternatively, the tantalum source may be supplied via a liquid MFC (mass flow controller) that injects the source liquid into the heated vaporizer.

Exemplary Deposition Conditions are:

Pressure: 0.1 to 1 Torr (typically 0.2–0.3 Torr)
TAETO flow: 0.1 to 1.0 cc/min (typically 0.2–0.4 cc/min)
O2 flow: 500–1000 sccm (typically 1000 sccm)
N2 carrier flow: 500–1000 sccm (typically 750 sccm)
Temperature: 410–450° C.
Time: on the order of 10 minutes with a growth rate of 10–15 Å/min.

After deposition, the furnace tube is cycle purged to remove any TAETO before cooling down to unload temperature and to bring the chamber back to atmospheric pressure. The overall process takes approximately 3–4 hours. Alternatively, a RTP process may be used with temperatures of 400–500° C. and shorter duration.

Following high-K formation, the stack is again subjected to the remote plasma process described above and a top portion of the high-K dielectric will be converted to a nitride 107. The nitride layer 107 will have a thickness on the order of 2–50 Angstroms. The formation of the nitride layer 107 may be followed by an optional anneal to reduce leakage and provide for a robust interface. For example, the device may be annealed in nitrogen at a temperature on the order of 800° C. for a duration on the order of two minutes in an RTA system or for on the order of 30 minutes in a furnace.

Figure 2D:
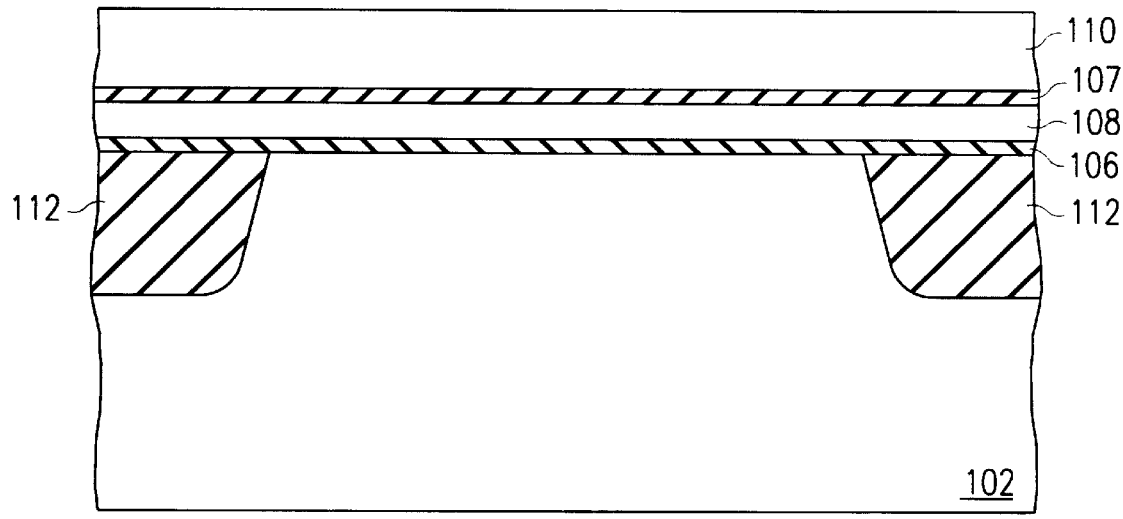

Referring to FIG. 2D, gate electrode material, 110 is deposited over the nitride layer 107. Gate electrode 110 preferably comprises polysilicon. In another embodiment, the gate electrode comprises a metal gate. The metal chosen may need to be matched to the dielectric layer 108. For example, gate electrode 110 may comprise a stack of tungsten, aluminum, or copper along with the nitride layer 107. In another embodiment, gate electrode 110 comprises a layer of tungsten (W) having a thickness on the order of 800 Å overlying a layer of titanium-nitride (TiN) having a thickness on the order of 200 Å.

Finally, gate electrode material 110, high-K layer 108 and silicon-oxynitride layer 106, and nitride layer 107 are patterned and etched to form gate stack 104 as shown in FIG. 2A. Fabrication of transistor 100 is completed by implanting drain extension regions 116, depositing and etching a dielectric to form sidewall spacers 117, and implanting source/drain regions 114.

In another embodiment of the instant invention, the high-K dielectric is formed directly on the silicon substrate 102. The formation of the remaining layers of the dielectric stack will then be as described above.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method of fabricating an integrated circuit MOSFET transistor, comprising the steps of:

forming a dielectric layer with an upper surface over a semiconductor body;

forming a high-K dielectric layer with an upper surface over said dielectric layer;

subjecting said high-K dielectric layer to a remote plasma nitridation to convert said upper surface of the high-K dielectric to a nitride layer;

forming a conductive layer on said nitride layer;

patterning and etching said conductive layer, said high-K dielectric layer, said dielectric layer and said nitride layer to form a gate stack;

forming drain extension regions in said semiconductor body adjacent said gate stack;

forming sidewall spacers over said semiconductor body adjacent said gate stack; and forming source/drain regions in said semiconductor body adjacent said sidewall spacers.

2. The method of claim 1 wherein said high-K dielectric comprises an oxygen-containing material.

3. The method of claim 1 wherein said high-K dielectric layer comprises a material selected from the group consisting of: Ta2O5, BaTiO3, TiO2, CeO2, and BST.

4. The method of claim 1 wherein said conductive layer comprises a silicon-containing material.

5. The method of claim 1 wherein said conductive layer comprises polysilicon.

6. The method of claim 1 wherein said conductive layer comprises a metal.

7. The method of claim 1 wherein said conductive layer comprises a tungsten layer overlying a titanium-nitride layer.

8. The method of claim 1, wherein said remote plasma nitridation uses nitrogen containing precursors selected from the group consisting of $N_2$, $NH_3$, NO, and $N_2O$.

9. The method of claim 1, wherein said remote plasma nitridation occurs at a temperature in the range of 77 K–773 K.

10. The method of claim 1, wherein said remote plasma nitridation occurs at a pressure in the range of 1 to 50 mTorr.

11. The method of claim 1, wherein said remote plasma nitridation comprises a plasma density in the range of $1 \times 10^{10}$ to $1 \times 10^{12}$.

12. The method of claim 1, wherein said remote plasma nitridation comprises a nitrogen flow in the range of 1 to 100 sccm.

13. The method of claim 1, wherein said remote plasma nitridation comprises a duration in the range of 10 to 60 seconds.

14. A method of fabrication an integrated circuit MOS transistor, comprising the steps of:

forming a silicon dioxide layer over a semiconductor body;

subjecting said silicon dioxide layer to a remote plasma nitridation to convert said silicon dioxide layer to a silicon-oxynitride layer;

forming a high-k dielectric layer with an upper surface over said silicon-oxynitride layer, said high-K dielectric layer having a dielectric constant greater than 10;

subjecting said high-k dielectric layer to a remote plasma nitridation to convert said upper surface of said high-k dielectric to a nitride;

forming a conductive layer over said high-K dielectric layer; and patterning and etching said conductive layer, said high-K dielectric layer, said nitride, and said silicon oxynitride layer to form a gate stack.

15. The method of claim 14, further comprising the steps of:

forming drain extension regions in said semiconductor body adjacent said gate stack;

forming sidewall spacers over said semiconductor body adjacent said gate stack; and forming source/drain regions in said semiconductor body adjacent said sidewall spacers.

16. The method of claim 14, wherein said silicon dioxide layer has a thickness less than 20 Angstroms.

17. The method of claim 14, wherein said high-K dielectric layer comprises an oxygen-containing material.

18. The method of claim 14, wherein said conductive layer comprises a tungsten layer overlying a titanium-nitride layer.

19. The method of claim 14, wherein said conductive layer comprises a polysilicon layer.

* * * * *